United States Patent [19]

Miyamoto

[11] Patent Number: 4,905,199
[45] Date of Patent: Feb. 27, 1990

[54] METHOD OF AND APPARATUS FOR REDUCING CURRENT OF SEMICONDUCTOR MEMORY DEVICE

[75] Inventor: Takayuki Miyamoto, Hyogo, Japan

[73] Assignee: Mitsubishi Denki Kabushiki Kaisha, Tokyo, Japan

[21] Appl. No.: 228,587

[22] Filed: Aug. 5, 1988

[30] Foreign Application Priority Data

Aug. 7, 1987 [JP] Japan .................. 62-198683

[51] Int. Cl.$^4$ .................. G11C 7/00; G11C 8/00; H03K 3/01

[52] U.S. Cl. .................. 365/226; 365/189.09; 365/189.03; 365/242; 365/227; 307/296.2; 307/296.8

[58] Field of Search .................. 365/189.09, 189.03, 365/226, 227, 242, 193; 307/296 R, 297

[56] References Cited

U.S. PATENT DOCUMENTS

4,780,854 10/1988 Watanabe et al. .................. 365/226
4,817,055 3/1989 Arakawa et al. .................. 365/226

OTHER PUBLICATIONS

IEEE J. of Sol. St. Circuits: "A Fast 256k×4 CMOS DRAM with a Distributed Sense and Unique Restore Circuit" by H. Miyamoto et al, V. SC-22, No. 5, Oct. 1987, pp. 861–867.

IEEE J. of Sol. ST. Circuits: "A Reliable 1-Mbit DRAM with a Multi-Bit Test Mode" by M. Kumanoya et al, V. SC-20, No. 5, Oct. 1985, pp. 909–913.

Weste, Neil H. E. et al, Principles of CMOS VLSI Design: A System Perspective, Addison-Wesley Publishing Co., Reading MA: pp. 227–229.

Primary Examiner—Stuart N. Hecker
Assistant Examiner—Melissa J. Koval
Attorney, Agent, or Firm—Lowe, Price, Leblanc, Becker & Shur

[57] ABSTRACT

A circuit (50) is provided in a dynamic RAM (1) for detecting establishment of a substrate bias voltage ($V_{BB}$) when the power is first turned on. A NAND gate (5d) in a clock generator circuit (10) immediately applies a high level signal to an inner circuit (11) when the power is turned on. Successively, the NAND gate (5d) applies a $\overline{RAS}$ signal to the inner circuit (11) in response to the establishment of $V_{BB}$. Therefore, the dynamic RAM (1) is brought to a standby state immediately after the power is turned on and thereafter is controlled by the $\overline{RAS}$ signal. Consequently, flow of excessive current and latch-up immediately after the power is turned on can be prevented.

11 Claims, 11 Drawing Sheets

OSCILLATOR 291

METHOD OF AND APPARATUS FOR REDUCING CURRENT OF SEMICONDUCTOR MEMORY DEVICE

CROSS-REFERENCE TO RELATED, COPENDING APPLICATION

Related, copending application of particular interest to the instant application is, entitled "Method of and Apparatus for Reducing Current of Semiconductor Memory Device", filed and assigned to the same assignee of the instant application.

BACKGROUND OF THE INVENTION

1. Field of the Invention

The present invention relates generally to semiconductor memory devices, and more particularly, a method of and an apparatus for reducing current flow from a power supply into a memory device immediately after the power supply is turned on.

2. Description of the Prior Art

FIG. 1 is a block diagram showing a memory board generally employed in apparatuses utilizing computers. Referring to FIG. 1, the memory board 40 comprises a number of memory chips 1 for storing data signals and a control circuit 41 for controlling the memory chip 1. The memory chip 1 is connected to receive voltage from an external power supply $V_{CC1}$ through a terminal 42 and the control circuit 41 is connected to receive a voltage from another external power supply $V_{CC2}$ through a terminal 43. The control circuit 41 generates a $\overline{RAS}$ (Row Address Strobe) signal, a $\overline{CAS}$ (Column Address Strobe) signal and address signals, and controls reading/writing of the memory chip 1 based on instructions from a CPU (Central Processing Unit).

In order to supply power to the memory chip 1 and the control circuit 41, different power supplies $V_{CC1}$ and $V_{CC2}$ such as shown in FIG. 1 are utilized, or a common power supply is utilized. For example, if a backup power supply for a memory chip 1 is used, two different supply voltages are applied. In either case, the level (high or low) of the $\overline{RAS}$ signal applied to the memory chip 1 depends on the system when the power is turned on.

FIG. 2 is a block diagram showing a conventional 1 M-bit dynamic RAM (Random Access Memory Device). The dynamic RAM such as shown in FIG. 1 is disclosed in "A reliable 1-M bit DRAM with a multi-bit-test mode" by M. Kumanoya et al., 1985 (IEEE Journal Solid-State Circuits, vol. SC-20, pp. 909-913) and also in "A Fast 256K×4 CMOS DRAM with a Distributed Sense and Unique Restore Circuits" by H. Miyamoto et al., 1987 (IEEE Journal Solid-State Circuits, vol. SC-22, pp. 861-867).

Referring to FIG. 2, the dynamic RAM comprises a clock generator circuit 10 for outputting clock signals $\phi_1$ and $\phi_2$ which control this dynamic RAM in response to a $\overline{CAS}$ signal and a $\overline{RAS}$ signal. The $\overline{CAS}$ signal and the $\overline{RAS}$ signal are externally applied through a $\overline{CAS}$ terminal 8 and a $\overline{RAS}$ terminal 4, respectively. A power supply $V_{CC}$ (5 V) and the ground $V_{SS}$ (0 V) are externally applied through a power supply terminal 2 and a ground terminal 3, respectively.

FIG. 3 is a timing chart showing the change of the current to be consumed in the dynamic RAM. Referring to FIG. 3, the dynamic RAM has two states of operation, that is, standby state and active state. The dynamic RAM is brought to the standby state when a high level $\overline{RAS}$ signal is applied, while it is brought to the active state when a low level $\overline{RAS}$ signal is applied. As is apparent from the figure, the current Icc to be consumed flowing from the power supply ($V_{CC}$ shown in FIG. 2) changes dependent on the state of operation of the dynamic RAM.

In the standby state, an approximately constant current $I_2$ of about 1~3 mA flows from the power supply $V_{CC}$ to the dynamic RAM. (The reason for this will be described later.)

Immediately after the change of the RAS signal from high level to low level, the dynamic RAM is brought to the active state and a transient current $I_a$ flows. The current $I_a$ mainly comprises a charging current for activating the clock generator circuit 10 and an operating current for operating the row address buffer 21 and the row decoder 22 in FIG. 2. After 30~50n sec from the change of the $\overline{RAS}$ signal to the low level, a transient current $I_b$ flows. The current $I_b$ is consumed by the sense amplifier 24 to charge bit lines in the memory array 25. The bit line charging operation by the sense amplifier 24 in the active state will be described in detail later.

When the current $I_b$ is decreased, a constant current $I_4$ flows to activate the data output buffer 27. The current $I_4$ is less than 10 mA in a normal state.

Thereafter, immediately after the change of the $\overline{RAS}$ signal from the low level to the high level, the dynamic RAM returns to the standby state and a transient current $I_c$ flows. The current $I_c$ mainly comprises a current for bringing the clock generator circuit 10 to the standby state and a current for bringing the row address buffer 21 and the row decoder 22 to the standby state.

FIG. 4 is a schematic diagram showing the clock generator circuit of the dynamic RAM in FIG. 2. Referring to FIG. 4, the clock generator circuit 10 comprises a buffer circuit connected to a $\overline{RAS}$ terminal 4 and a inner circuit 11 connected between a power supply $V_{CC}$ and the ground VSS for outputting clock signals $\phi_1$ and $\phi_2$ in response to a signal from the buffer circuit. The buffer circuit comprises two inverters 5a and 5b connected in series. A reference character Icc represents consumed current flowing from the power supply $V_{CC}$ to a dynamic RAM 1.

In general, for a circuit receiving an input signal from the outside, a buffer circuit connected to an input terminal comprises inverters. For example, a buffer circuit employing inverters is described by Neil H. E. Weste et al. in "PRINCIPLES OF CMOS VLSI DESIGN", pp. 227-229, published by ADDISON-WESLEY PUBLISHING COMPANY in 1985.

A description is given of operation which occurs when the supply voltage $V_{CC}$ is externally applied to the dynamic RAM in FIG. 4.

FIGS. 5 and 6 are timing charts showing a change of signals for explaining the operation of the dynamic RAM in FIG. 4. Referring to FIGS. 5 and 6, the supply voltage $V_{CC}$ starts to be applied to the terminal 2 from a time $t_1$ and the applied voltage rises up to a predetermined voltage level. When the applied voltage reaches the predetermined voltage level, it will not change thereafter.

FIG. 5 shows the case in which a high-level $\overline{RAS}$ signal is applied to the $\overline{RAS}$ terminal 4 before the time $t_1$. The dynamic RAM is in the standby state when the $\overline{RAS}$ signal is at high level and it is in the active state when the $\overline{RAS}$ signal is at low level. Power consumption is small when the dynamic RAM is in the standby state and it is large when the dynamic RAM is in the active state. Therefore, the supply voltage $V_{CC}$ (for example 5 V) is applied to the dynamic RAM while the dynamic RAM is in the standby state in FIG. 5. As a result, after the current Icc flowing into the dynamic RAM reaches its small peak value of $I_1$ (several mA) at a time $t_2$, the value is reduced to $I_2$ which is smaller than $I_1$, and then stabilized. The value of $I_2$ is a current value necessary for operation in the standby state. The reason why these different values flow will be described in the following.

FIG. 7 is a schematic diagram showing a buffer circuit in the clock generator circuit 10 shown in FIG. 4. Referring to FIG. 7, the buffer circuit comprises two inverters 5a and 6a. The inverter 5a comprises a series connection of a P channel MOS transistor Q1 and an N channel MOS transistor Q2 connected between the power supply $V_{CC}$ and the ground $V_{SS}$. The gates of the transistors Q1 and Q2 are connected together and the $\overline{RAS}$ signal is applied thereto. The inverter 5b also comprises a P channel MOS transistor Q3 and an N channel MOS transistor Q4 connected in a similar manner as the inverter 5a. The gates of the transistors Q3 and Q4 are connected together to the output of the inverter 5a. A stray capacitance C10 exists between the output node N10 of the inverter 5a and the ground $V_{SS}$, and a stray capacitance C11 exists between the output node N11 of the inverter 5b and the ground $V_{SS}$.

FIG. 8 is a timing chart showing the change of the voltage at output nodes of two inverters shown in FIG. 7 when the power supply $V_{CC}$ rises. Referring to FIGS. 7 and 8, the nodes N10 and N11 are at 0 V before the voltage of the power supply $V_{CC}$ rises. When the power supply $V_{CC}$ rises after a high level $\overline{RAS}$ signal is applied, the output node N10 of the inverter 5a remains at 0 V. Meanwhile, the output node N11 of the inverter 5b is brought to a high level voltage, so that the stray capacitance C11 existing between the node N11 and the ground $V_{SS}$ is charged. Therefore, a charging current flows from the power supply $V_{CC}$.

Various peripheral circuits are provided in the dynamic RAM as shown in FIG. 2, each of which comprising, in most cases, circuits such as shown in FIG. 7. As described above, immediately after the power supply $V_{CC}$ is turned on, charging currents for charging stray capacitances in these circuits flow in, causing a peak current $I_1$ at the time $t_2$ shown in FIG. 5.

Referring again to FIG. 7, the current $I_2$ of a constant value consumed after the time $t_2$ will be described. The current $I_2$ corresponds to the current $I_2$ from the power supply $V_{CC}$ which is shown in FIG. 3.

Generally, the $\overline{RAS}$ signal has a voltage level called TTL (Transistor Transistor Logic) level. More specifically, the high level of the $\overline{RAS}$ signal is about 2.4 V when the power supply $V_{CC}$ is 5 V. The transistor Q2 turns on in response to a high level $\overline{RAS}$ signal applied between the gate and the source thereof. Meanwhile, the transistor Q1 receives approximately $-2.6[=-(V_{CC}-2.4)]V$ between the gate and the source thereof, and turns on. Therefore, both transistors Q1 and Q2 turn on and a current flows from the power supply $V_{CC}$ to the ground $V_{SS}$. This current is included in the current $I_2$ shown in FIG. 5, which flows constantly. In addition, a current which will be described in the following is also included in the current $I_2$.

FIG. 9 is a schematic diagram showing a ring oscillator provided for generating negative voltage in the dynamic RAM. Referring to FIG. 9, the ring oscillator comprises an odd-number of inverters 29 which is connected in series to form a ring. A pulsating current which fluctuates in several mega-hertz frequency flows into the ring oscillator from the power supply $V_{CC}$. Since this current is of high frequency, it seems as a direct current and is included in the current $I_2$ shown in FIG. 5.

On the other hand, the timing chart of the FIG. 6 shows the case in which the supply voltage $V_{CC}$ starts to be applied to the dynamic RAM from the time $t_1$, while the $\overline{RAS}$ signal is low level. Since the supply voltage $V_{CC}$ is applied to the RAM chip while the RAM chip is in the active state, the current Icc after the time $t_1$ is increased. At this time, since each node of circuits in the dynamic RAM has not been necessarily brought to a predetermined high or low level, excessive current Icc flows therein. As a result, after the current Icc reaches its big peak value of $I_3$ (several tens of mA) which is bigger than the value of $I_1$ at the time $t_3$, it is reduced to the value of $I_4$ (below 10 mA) which is considerably smaller than the value of $I_3$, and then stabilized. The value of $I_4$ is a current value necessary for operation in the active state, which is the same as that shown in FIG. 3.

A description is given of the reason for the inflow of the excessive current hereinafter.

FIG. 10 is a schematic diagram showing an example of portions of the sense amplifier 24 and the memory array 25 of the dynamic RAM $\overline{bit\ line}$ shown in FIG. 2. Referring to FIG. 10, the sense amplifier 24 comprises two latch circuits connected between a bit line 241 and a $\overline{bit\ line}$ 242. One latch circuit is constituted by N channel MOS transistors Q10 and Q11 and is connected to the ground $V_{SS}$ through an N channel MOS transistor Q12. The other circuit is constituted by P channel MOS transistors Q13 and Q14 and is connected to the power supply $V_{CC}$ through a P channel MOS transistor Q15. The gates of the transistors Q12 and Q15 are connected such that they receive sense signals $\phi_s$ and $\overline{\phi_s}$ respectively, which signals are inverted from each other.

The memory array 25 is connected to the sense amplifier 24 through the bit lines 241 and 242. Memory cells MC each consisted of one N channel MOS transistor and a capacitor are connected between the bit line 241 or 242 and the word line 243. There are stray capacitances $C_{B1}$ and $C_{B2}$ between respective bit lines 241 and 242 and the ground $V_{SS}$.

FIG. 11 is a timing chart showing the operation of a circuit shown in FIG. 10 when the power supply $V_{CC}$ rises after a high level $\overline{RAS}$ signal is applied (in this case, it corresponds to the case shown in FIG. 5). Referring to FIGS. 10 and 11, the bit lines 241 and 242 are at 0 V before the power supply $V_{CC}$ rises. When a high level $\overline{RAS}$ signal is applied and the power supply $V_{CC}$ rises, a sense signal $\phi_s$ of 0 V is applied to the gate of the transistor Q12. Therefore, the transistor Q12 remains off.

Meanwhile, a sense signal $\overline{\phi_s}$ which goes to a high level from 0 V simultaneously with the rise of the power supply $V_{CC}$ is applied to the gate of the transistor Q15. Therefore, the transistor Q15 also remains off. Since both transistors Q12 and Q15 are off, the stray capacitances $C_{B1}$ and $C_{B2}$ are not charged. That is, the bit lines 241 and 242 are not charged by the power supply $V_{CC}$, and no current flows in from the power supply $V_{CC}$.

FIG. 12 shows a timing chart in which the power supply $V_{CC}$ rises while the $\overline{RAS}$ signal remains at low level (corresponding to the case shown in FIG. 6). Referring to FIGS. 10 and 12, the bit lines 241 and 242 are at 0 V before the rise of the power supply $V_{CC}$. A sense signal $\phi_S$ which has risen to a high level from 0 V simultaneously with the rise of the power supply $V_{CC}$ is applied to the gate of the transistor Q12. Therefore, the transistor Q12 turns on. Meanwhile, a sense signal $\overline{\phi}_S$ of 0 V is applied to the transistor Q15, and the transistor Q15 also turns on. Since both transistors Q12 and Q15 are turned on, current flows into the bit lines 241 and 242 from the power supply $V_{CC}$ through the transistor Q15 and to the ground $V_{SS}$ through the transistor Q12. The voltages at the bit lines 241 and 242 are slightly increased from 0 V due to this current. On this occasion, a through current flows from the power supply $V_{CC}$ to the ground $V_{SS}$ through the transistor Q15, Q13 or Q14, Q10 or Q11, and Q12.

Thereafter, since the sense amplifier 24 comprises two latch circuits as described above, the bit line 241, for example, is brought to a high level and the bit line 242 is brought to a low level. Which of the two bit lines 241 and 242 is brought to the high level is determined by a slight imbalance between the stray capacitances $C_{B1}$ and $C_{B2}$ having approximately the same capacitance value. Since one of the two bit lines 241 and 242 is charged by the power supply $V_{CC}$, a charging current flows into the dynamic RAM from the power supply $V_{CC}$. Generally, one stray capacitance $C_{B1}$ or $C_{B2}$ has a value less than 0.4 pF. Therefore, in a case of 1 mega-bit dynamic RAM, for example, 2048 stray capacitances are charged, with the total capacitance value being 819 pF ($=0.4$ pF$\times 2048$). A current for charging the total capacitance is included in the current $I_3$ shown in FIG. 6.

The current $I_3$ shown in FIG. 6 comprises the following current besides the above described through current and the charging current from the power supply $V_{CC}$. Referring again to FIG. 7, when the power supply $V_{CC}$ rises with the RAS signal being low level, the output node N10 of the inverter 5a is brought to a high level voltage from 0 V. Therefore, the stray capacitance C10 existing between the node N10 and the ground $V_{SS}$ is charged by the power supply $V_{CC}$ and a charging current flowing in from the power supply $V_{CC}$. As described above, the dynamic RAM comprises a number of circuits such as shown in FIG. 7 and such charging currents are included in the current $I_3$ shown in FIG. 6.

Meanwhile, the constant current $I_4$ which flows after the time $t_3$ corresponds to the current $I_4$ of the timing chart shown in FIG. 3.

As described above, in the conventional dynamic RAM, the excessive current $I_3$ (for example 50 mA) from the power supply $V_{CC}$ flows in when the power supply $V_{CC}$ is turned on. Because of this excessive current $I_3$, power supply capacity could be insufficient, so that other circuits could not operate correctly or the line fuse could be blown.

In addition, the excessive current $I_3$ may possibly cause a latch-up in the substrate of the dynamic RAM as will be described in the following.

FIG. 13A is a cross sectional view showing the structure of a conventional CMOS inverter on a substrate. A number of CMOS inverters such as shown in the figure are included in the peripheral circuit of the dynamic RAM.

Referring to FIG. 13A, the substrate bias voltage $V_{BB}$ is applied to a p type silicon substrate 30 through a substrate bias conductor 35. The substrate bias voltage (hereinafter simply referred to as $V_{BB}$) is generated from a $V_{BB}$ generating circuit 29 provided on the RAM chip. A p channel MOS transistor Q5 is formed in an n-well 31 formed in the p type silicon substrate 30. An n+ diffused layer 32 serves to fix a voltage of n-well 31 to the supply voltage $V_{CC}$ which is connected to a $V_{CC}$ power supply conductor. An n+ diffused layer 33 is formed in the p type silicon substrate 30 and it is connected to the $V_{CC}$ power supply conductor. An n+ diffused layer 34 is formed in the p type silicon substrate 30 and it is connected to a ground conductor $V_{SS}$.

As seen from the drawing, a p-n junction capacitance $C_{WELL}$ formed between the n-well 31 and the p type silicon substrate 30 and a p-n junction capacitance Cn+ formed between the n + diffused layer 33 and the p type silicon substrate 30 form a component of the parasitic capacitance.

FIG. 13B is an equivalent circuit of the peripheral circuit shown in FIG. 13A and prepared for explaining parasitic bipolar transistors and a parasitic capacitance being parasitic on the dynamic RAM.

Referring to FIG. 13A and 13B, a mechanism of the latching-up is explained. The peripheral circuit comprises a parasitic bipolar transistor Tr$_1$ (pnp transistor) coupled between the power supply conductor $V_{CC}$ and the $V_{BB}$ generating circuit through resistance R$_2$, a parasitic bipolar transistor Tr$_2$ (npn transistor) coupled between the power supply conductor $V_{CC}$ through a resistance R$_1$ and the ground conductor $V_{SS}$, a total parasitic capacitance $C_P$ coupled between the power supply conductor $V_{CC}$ and the $V_{BB}$ generating circuit, and the $V_{BB}$ generating circuit coupled between the power supply conductor $V_{CC}$ and the ground conductor $V_{SS}$. The substrate bias $V_{BB}$ generating circuit is provided to provide a predetermined negative bias voltage to the substrate.

The transistor Tr$_1$ comprises a p+ diffusion layer in an n-well, an n+ diffusion layer 32 in the n-well and the substrate itself. The transistor Tr$_2$ comprises an n+ diffusion layer 34, the substrate itself and n+ layer 32 in the n-well. The $C_{WELL}$ is formed between n-well 31 and the substrate 30. The $V_{BB}$ generating circuit 29 usually keeps the substrate at $-3$ V. A reversed bias is applied between a base and an emitter of the transistor Tr$_2$. The transistor Tr$_2$ is in off state. Therefore, no voltage is applied between the base and the emitter of the transistor Tr$_1$ and the transistor Tr$_1$ is also in off state.

The substrate 30 is brought to a positive potential when currents are flowing from the power supply $V_{CC}$. Therefore, a forward bias voltage is applied to the p-n junction in the substrate, causing a latch-up. Namely, since the forward bias voltage is applied between the base and the emitter of the transistor Tr$_2$, the transistor Tr$_2$ turns on. A current flows from the power supply conductor $V_{CC}$ to the ground conductor $V_{SS}$ through the resistance R$_1$ and the transistor Tr$_2$. As there is the resistance R$_1$ in the substrate, potential drops occur and a forward bias voltage is applied between the base and the emitter of the transistor Tr$_1$. As a result, the transistor Tr$_1$ turns on. A current flows to the base of the transistor Tr$_2$ and the transistor Tr$_2$ is kept turned on (corresponding to the state ① shown in FIG. 13B). As there is the resistance R$_1$ in the substrate, the transistor Tr₁ is kept turning on (corresponding to the state ② shown in FIG. 13B). States ① and ② occur continuously and a current continues to flow from the power supply conductor $V_{CC}$ to the ground conductor $V_{SS}$. This phenomenon is called a latch-up. In order to prevent the latch-up phenomenon, a substrate bias voltage generating circuit which will be described in the following is provided to bring the substrate 30 to a negative potential.

FIG. 14A is a schematic diagram showing one example of a conventional $V_{BB}$ generating circuit. Referring to FIG. 14A, the $V_{BB}$ generating circuit comprises a ring oscillator 291 having an odd-number of inverters connected in a ring, and a charge pump circuit 292 connected to the output of the ring oscillator 291. The charge pump circuit 292 comprises a charge pump capacitor $C_A$ and two n channel transistors Q21 and Q22.

FIG. 14B is a timing chart for illustrating the operation of the $V_{BB}$ generating circuit shown in FIG. 14A. The figure shows changes of an output signal $\phi_R$ of the ring oscillator 291, the potential of a node $N_A$ between the transistors Q21 and Q22 and of the output voltage $V_{BB}$. The operation will be described with reference to FIGS. 14A and 14B.

First, when a voltage signal at a rise of the output signal $\phi_R$ of the ring oscillator 291 is applied to the charge pump capacitor $C_A$ (time t11), the potential at the node $N_A$ rises due to the capacitive coupling. Then the transistor Q21 turns on, whereby the potential of the node $N_A$ is clamped at the threshold voltage $V_{TH}$ of the transistor Q21 (time $t_{12}$). When a voltage signal at a fall of the signal $\phi_R$ is applied to the capacitor $C_A$ (time $t_{13}$), the potential at the node $N_A$ is decreased due to the capacitive coupling. However, at this time the transistor Q22 turns on, whereby the output voltage $V_{BB}$ decreases and the potential at the node NA is clamped at a negative potential which is equal to the threshold voltage $V_{TH}$ of the transistor Q22 (time $t_{14}$). By the repetition of such cycle, the output voltage $V_{BB}$ is decreased to reach a prescribed voltage required as the substrate bias voltage.

FIG. 14C is a graph showing a relation between the output voltage and the number of pulses generated by the oscillation in the $V_{BB}$ generating circuit shown in FIG. 14A. Referring to FIG. 14C, the maximum amount of charges $Q_{MAX}$ pumped by the capacitor $C_A$ at one oscillation of the ring oscillator 291 will be $$Q_{MAX} = C_A \cdot (V_{CC} - 2V_{TH}) \quad (1)$$

where $V_{CC}$ is a supply voltage and $C_A$ is the capacitance value of the capacitor $C_A$. Therefore, the output voltage $V_{BB}$ obtained by N times of oscillation will be $$V_{BB} \leq (Q_{Max}/C_{SUB}) \cdot N \quad (2)$$

where, $C_{SUB}$ represents all p-n junction capacitances in the dynamic RAM such as the capacitances $C_{WELL}$ and $C_{n+}$ formed between the p type substrate 30 and the n-well 31 and the n+ diffusion layer 33. Consequently, the $V_{BB}$ generating circuit outputs the voltage of about $-(V_{CC} - 2V_{TH})$.

Although the $V_{BB}$ generating circuit is provided to prevent the latch-up, it requires much time after the power supply $V_{CC}$ turn on to output a prescribed voltage, as shown in FIG. 14C. Therefore, it cannot always prevent a latch-up caused by the excessive current I₃ immediately after the power supply $V_{CC}$ is turned on.

SUMMARY OF THE INVENTION

One object of the invention is to reduce excessive current flowing in a semiconductor memory device, when power is first turned on.

Another object is to reduce excessive current in a DRAM, when power is first turned on.

Another object is to reduce excessive current in a DRAM having first and second operating states, when power is first turned on.

Yet another object is to reduce excessive current in a DRAM having active and standby operating states, when power is first turned on.

Still another object is to reduce excessive current in a DRAM having active and standby operating states, wherein the DRAM has a tendency to be in the active state, when power is first applied.

A still further object of the present invention is to prevent the dynamic RAM from being brought to the latch-up state by an excessive current when the power is first turned on.

Another object of the invention is to improve the reliability of semiconductor memory devices.

Still another object is to reduce power supply requirements in a semiconductor memory device system.

Yet another object is to prevent damage to semiconductor memory devices as a result of excessive current flow therethrough when power is first applied.

Briefly stated, the dynamic RAM of the present invention comprises a circuit for generating the pseudo-state signal when the power is applied, a circuit for detecting that the substrate bias voltage is established in a prescribed level, and a switching circuit responsive to the establishment of the substrate bias voltage for applying either an external control signal or the pseudo-state signal to a control circuit of the dynamic RAM.

In operation, the dynamic RAM device operates in response to the pseudo-state signal with less current consumption until the substrate bias voltage is established. Therefore, the flow of the excessive current immediately after the power is turned on can be prevented. In addition, after the substrate bias voltage is established, the dynamic RAM operates in response to an external control signal. The memory device does not start operation in accordance with the external control signal until the substrate bias voltage reaches a prescribed level.

Therefore, malfunctions such as a latch-up immediately after the power is turned on can be prevented.

According to a preferred embodiment, a counter circuit is provided to detect the establishment of the substrate bias voltage. The counter circuit is connected to the substrate bias voltage generating circuit and counts pulse signals generated by an oscillation circuit contained therein. By counting a prescribed number of pulse signals, the substrate bias voltage can be detected. The detection can be surely and easily carried out only by providing the counter circuit.

In another aspect, the present invention is a method for operating a dynamic RAM, comprising the steps of detecting the application of power to generate a pseudo-state signal; detecting that the substrate bias voltage established in a prescribed level; and selectively applying either an external control signal or the pseudo-state signal to a control circuit of the dynamic RAM in response to the establishment of the substrate bias voltage.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 15:
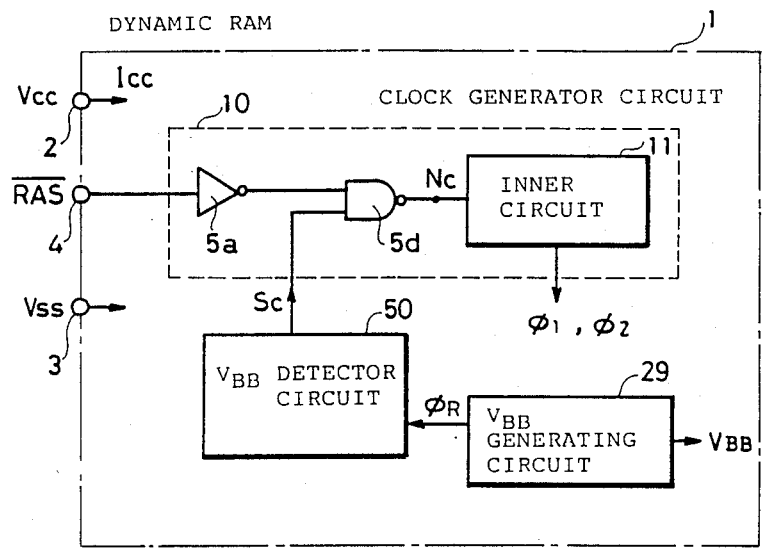
FIG. 15 is a block diagram showing an improved clock generator circuit and a circuit for controlling the same in a dynamic RAM in accordance with one embodiment of the present invention.

FIG. 15 is a block diagram showing a improved clock generator circuit and a circuit for controlling the same in a dynamic RAM in accordance with one embodiment of the present invention. Referring to FIG. 15, the clock generator circuit 10 comprises a buffer circuit connected to a $\overline{RAS}$ terminal 4, and an internal circuit 11 responsive to an output signal from the buffer circuit to output clock signals $\phi_1$ and $\phi_2$. The buffer circuit comprises an inverter 5a having its input connected to the $\overline{RAS}$ terminal 4 and a NAND gate 5d having its one input connected to an output of the inverter 5a. The NAND gate 5d has its output connected to the internal circuit 11. The NAND gate 5d has its the other input connected to a $V_{BB}$ detecting circuit 50 for detecting the establishment of the substrate bias voltage ($V_{BB}$). The $V_{BB}$ detecting circuit 50 is connected to a $V_{BB}$ generating circuit 29.

Figure 16:
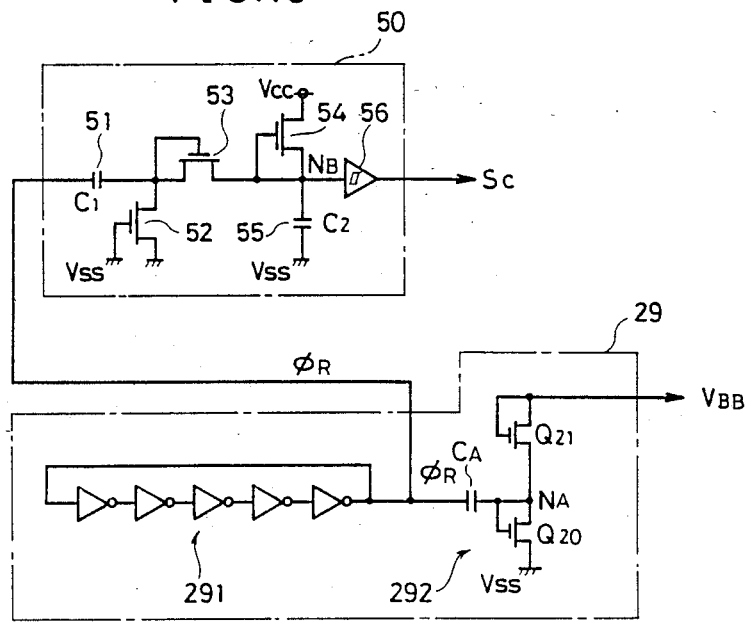
FIG. 16 is a schematic diagram showing a preferred example of the $V_{BB}$ detecting circuit and the $V_{BB}$ generating circuit shown in FIG. 15.

FIG. 16 is a schematic diagram showing a preferred embodiment of the $V_{BB}$ detecting circuit 50 and the $V_{BB}$ generating circuit 29 shown in FIG. 15. Referring to FIG. 16, the $V_{BB}$ detecting circuit 50 comprises a counter circuit which counts pulse signals $\phi_R$ generated by a ring oscillator 291 in the $V_{BB}$ generating circuit 29. More specifically, the $V_{BB}$ detecting circuit 50 comprises a capacitor 51 having one electrode connected to receive pulse signals $\phi_R$ from the ring oscillator 291; a N channel MOS transistor 53 having its gate and drain connected together to the other electrode of the capacitor 51; an N channel MOS transistor 52 having its drain connected to the other electrode of the capacitor 51 and its source and gate connected to the ground $V_{SS}$; an N channel MOS transistor 54 having its drain connected to a power supply $V_{CC}$ and its source and gate connected together to the source of the transistor 53; a capacitor 55 provided between the source of the transistor 53 and the ground $V_{SS}$; and an amplifier 56 having a hysteresis characteristics with the input connected to the source of the transistor 53. A switching signal $S_c$ is outputted from the amplifier 56 to be applied to the clock generator circuit 10.

Figure 14A:
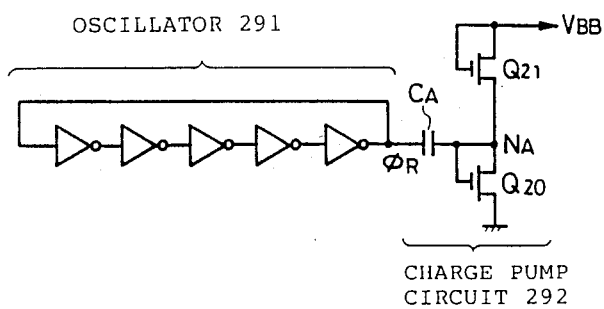
FIG. 14A is a schematic diagram showing one example of a conventional substrate bias voltage ($V_{BB}$) generating circuit.
Figure 14B:
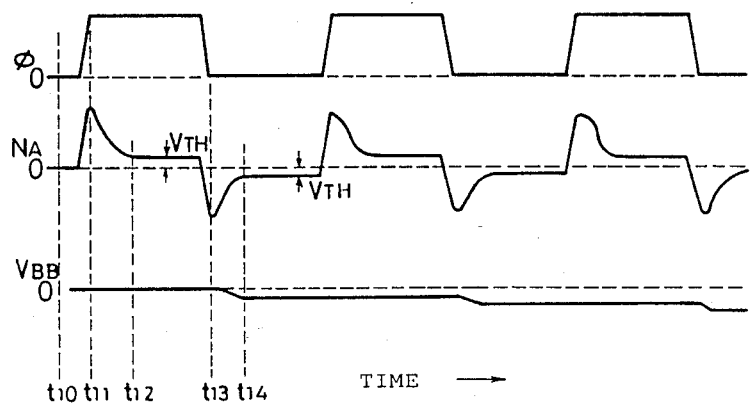
FIG. 14B is a timing chart for illustrating the operation of the, circuit shown in FIG. 14A.
Figure 14C:
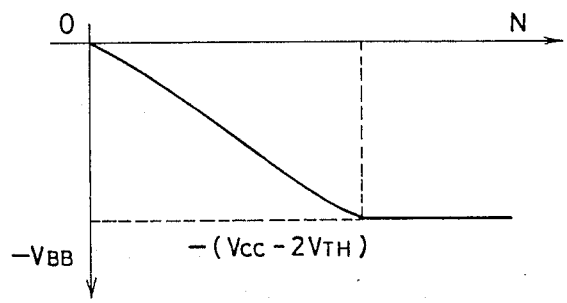
FIG. 14C is a graph showing a relation between an output voltage and number of pulses generated by oscillation in the circuit shown in FIG. 14A.

The $V_{BB}$ generating circuit 29 comprises a ring oscillator 291 and a charge pump circuit 292, whose circuit structure and operation is the same as that shown in FIG. 14A, so that the description thereof will be omitted.

In operation, before the power supply $V_{CC}$ is turned on, the node $N_B$ to which the source and gate of the transistor 54 are connected together is clamped at a voltage lower than the threshold voltage of the transistor 54 by the transistor 54. When the power supply $V_{CC}$ is turned on, the ring oscillator 291 starts the oscillating operation to generate pulse signals $\phi_R$. The charge pump circuit 291 receives the pulse signals $\phi_R$ and starts the charge pump operation to generate the substrate bias voltage ($V_{BB}$). Meanwhile, in the $V_{BB}$ detecting circuit 50, the charge pump circuit constituted by the capacitor 51 and the transistors 52 and 53 starts its operation, and positive charges are stored in the capacitor 55 through the transistor 53 in response to the pulse signals $\phi_R$. The time $t_{CH}$ required for charging the capacitor 55 will be approximately $$t_{CH} = T \cdot (C2/C1) \tag{1}$$

where T is the oscillation period of the ring oscillator 91 and C1 and C2 respectively represents capacitance values of the capacitors 51 and 55. Therefore, the amplifier 56 outputs a low level switching signal $S_C$ immediately after the power supply $V_{CC}$ is turned on, and after a prescribed time period, it outputs a high level signal $S_c$.

By appropriately setting the oscillation period T of the ring oscillator 291, the capacitance values C1 and C2 of the capacitors 51 and 55 and the threshold voltage of the transistor 54, the timing of the establishment of the desired substrate bias voltage ($V_{bb}$) from the $V_{BB}$ generating circuit 29 and the timing of the change of the switching signal $S_C$ from low level to high level coincides with each other. Consequently, the $V_{BB}$ detecting circuit 55 detects the establishment of the substrate bias voltage ($V_{BB}$) and outputs a high level switching signal $S_c$.

Figure 17:
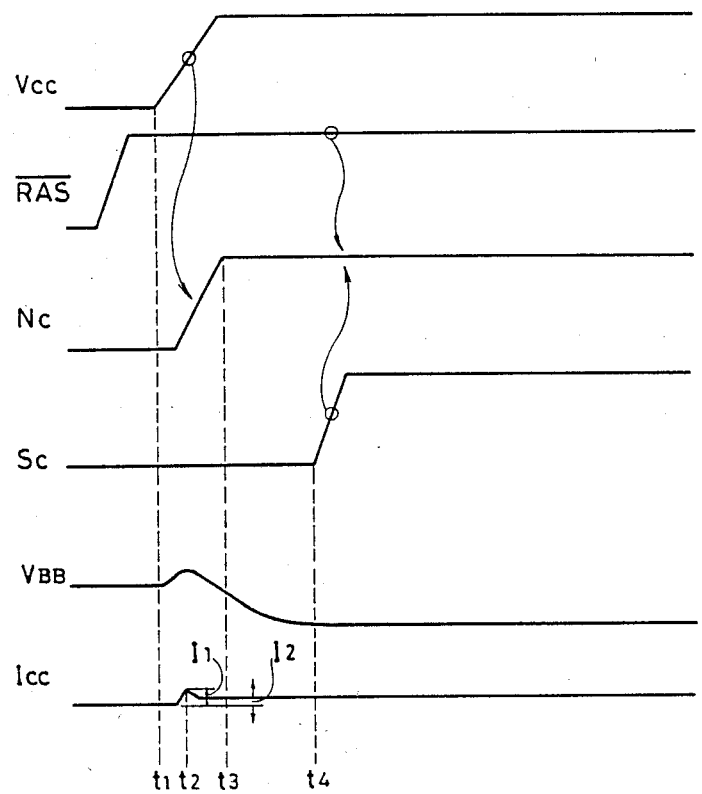
FIGS. 17 and 18 are timing charts for illustrating operation of the clock generator circuit shown in FIG. 15.
Figure 18:
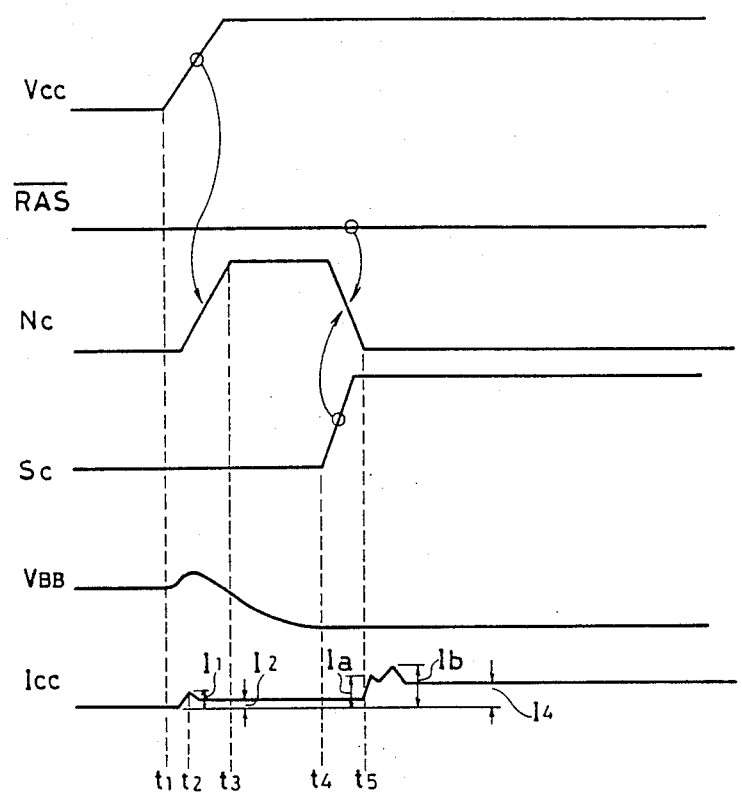

FIGS. 17 and 18 are timing charts for illustrating the operation of the clock generator circuit 10 shown in FIG. 15. Referring to FIGS. 17 and 18, the power supply voltage $V_{CC}$ is applied through the terminal 2 at the time $t_1$ and the applied voltage increased to a prescribed voltage level. After it reaches a prescribed voltage level, it remains as it is. $N_c$ represents a voltage at an input node of the internal circuit 11, that is, an output voltage of the AND gate 5d. After the power supply voltage $V_{CC}$ is applied, a low level switching signal $S_c$ is outputted as described above. The AND gate 5d outputs a high level signal in response to the signal $S_c$, so that the node $N_c$ is brought to a high level at time $t_3$. Therefore, the dynamic RAM is borught to a standby state after the time $t_3$.

Figure 1:
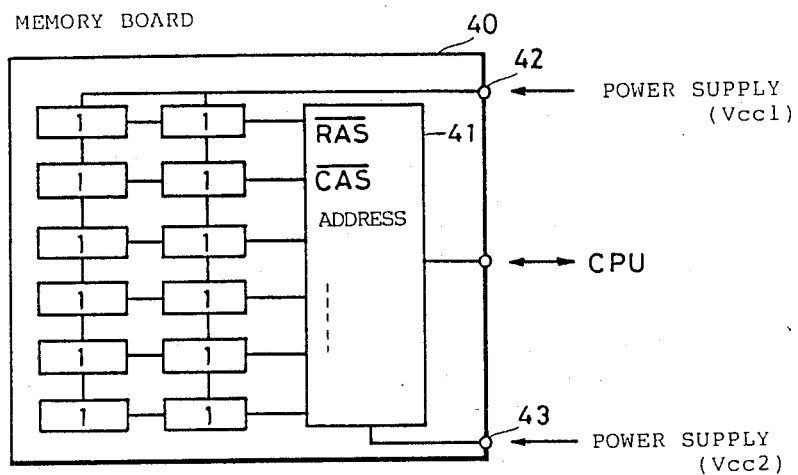
FIG. 1 is a block diagram showing a memory board employed in apparatuses utilizing computers.
Figure 3:
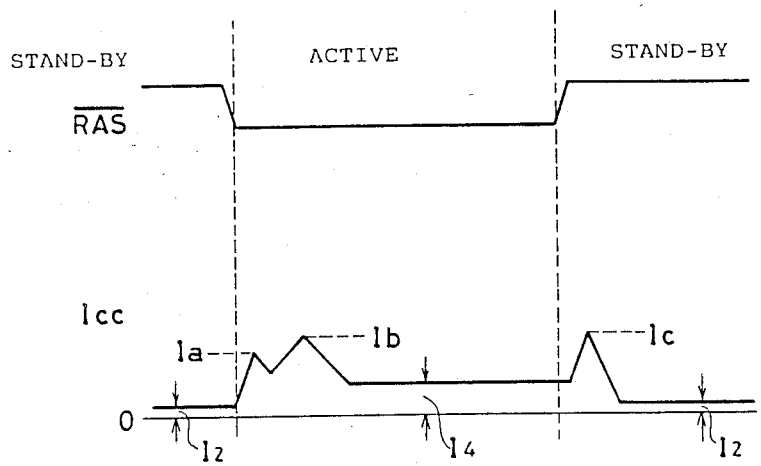
FIG. 3 is a timing chart showing the change of current to be consumed in a dynamic RAM.
Figure 2:
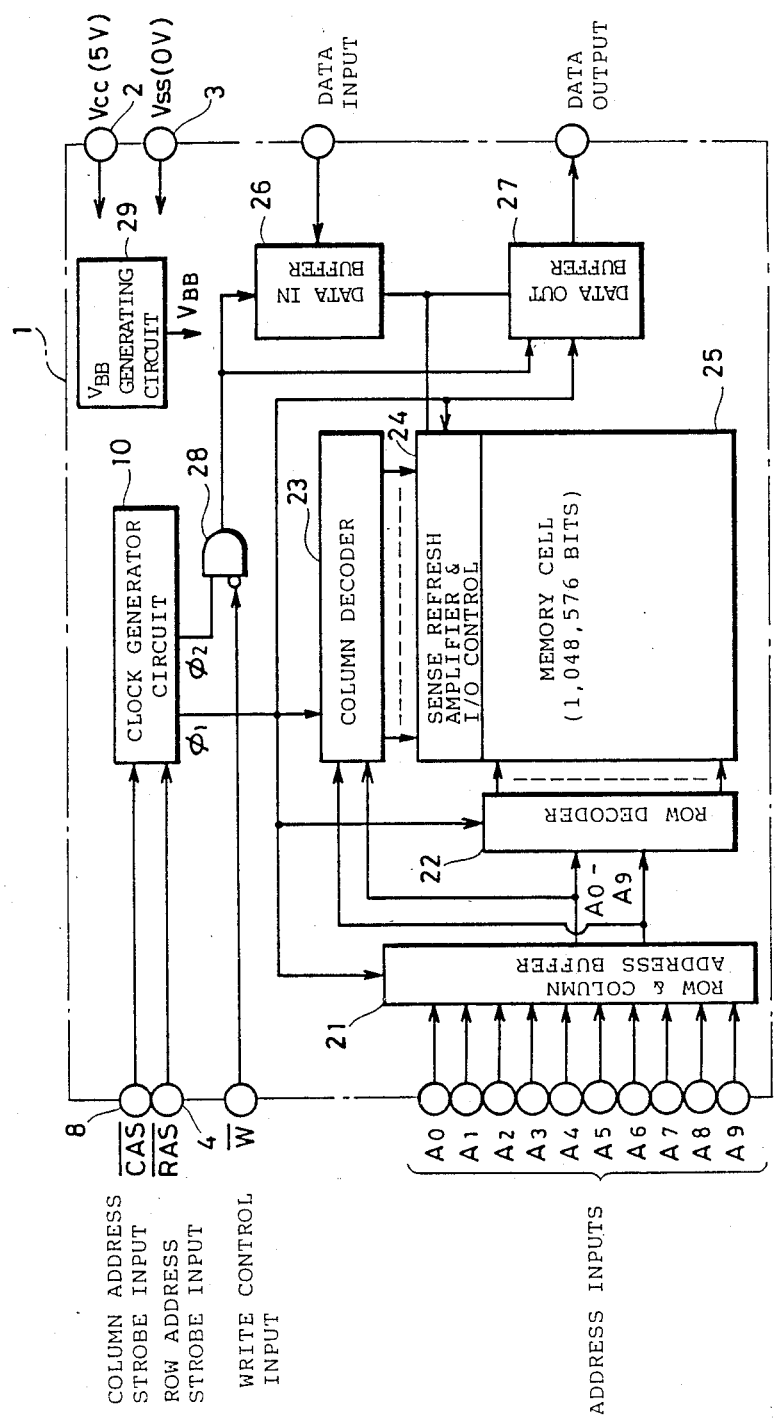
FIG. 2 is a block diagram showing the conventional 1 M-bit dynamic RAM.
Figure 4:
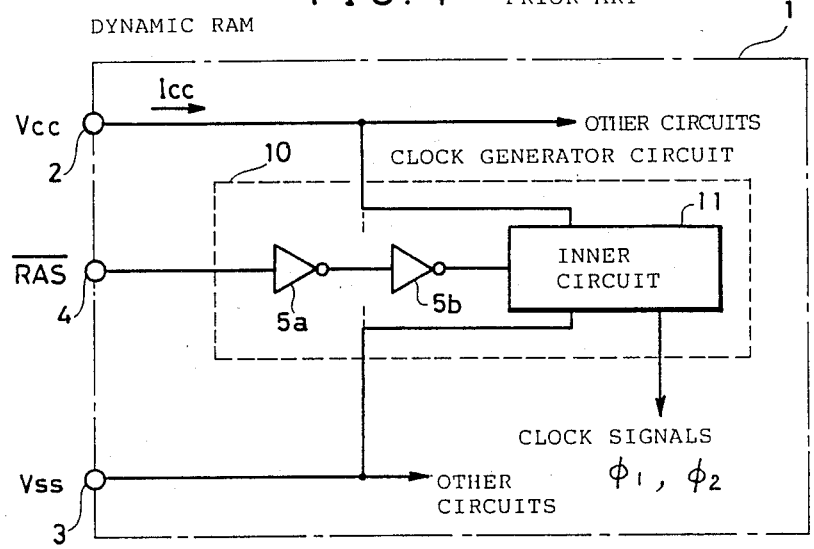
FIG. 4 is a schematic diagram showing the conventional clock generator circuit of the dynamic RAM of FIG. 2.
Figure 5:
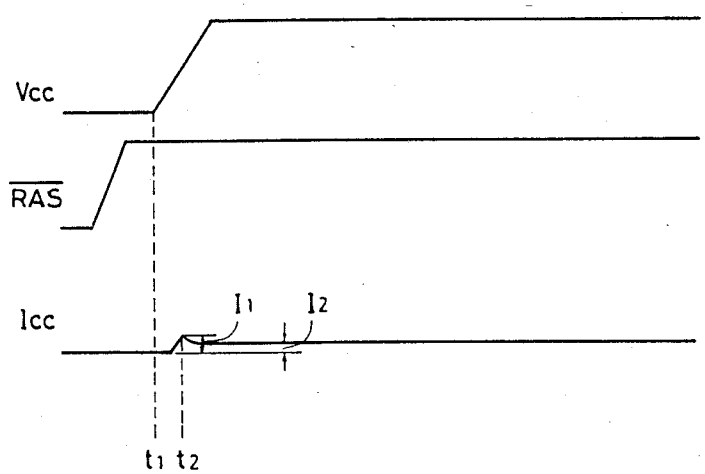
FIGS. 5 and 6 are timing charts for explaining operation of the clock generator circuit of FIG. 2.

FIG. 17 shows the case in which as high level $\overline{RAS}$ signal is applied to a terminal 4 before the time $t_1$. The $V_{bb}$ detecting circuit 50 outputs a high level signal $S_c$ ast the time $T_4$. However, since the AND gate 5d has received a low level signal from the inverter 5a, it outputs a high level signal succeedingly. Therefore, the case shown in FIG. 17 corresponds to that shown in FIG. 5. Namely, the current $I_{cc}$ flown into the dynamic RAM from the power supply $V_{CC}$ has a small peak value (several mA) of $I_1$ at the time $t_2$ and thereafter it is decreased to the value $I_2$ which is smaller than $I_1$ and remains as it is. The value $I_2$ is a current value required for the operation in the standby state.

Figure 6:
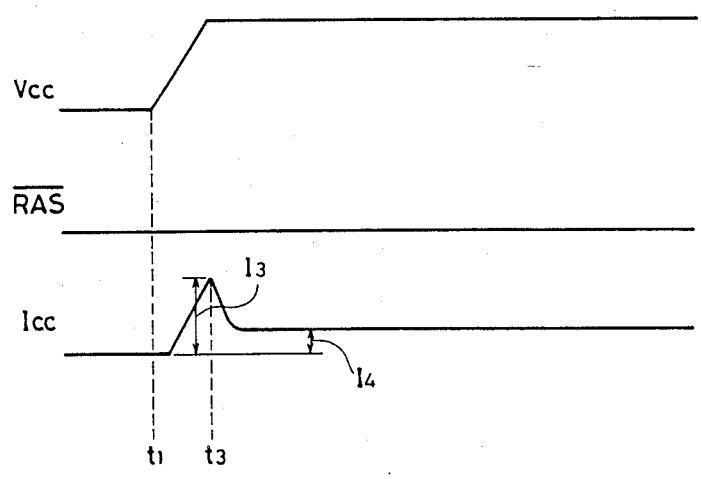
Figure 7:
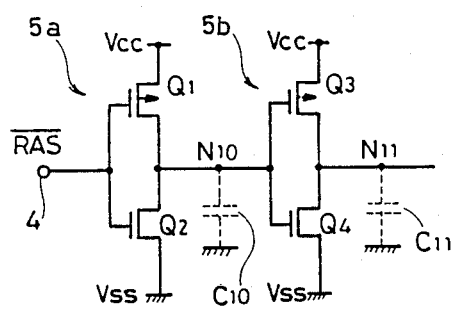
FIG. 7 is a schematic diagram showing a buffer circuit in the clock generator circuit shown in FIG. 4.
Figure 8:
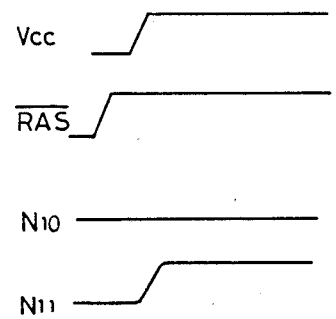
FIG. 8 is a timing chart for illustrating the operation of the buffer circuit shown in FIG. 7.
Figure 9:
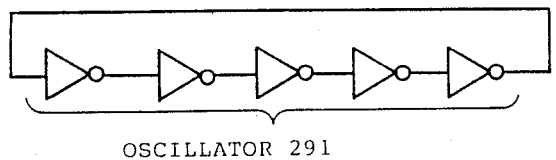
FIG. 9 is a schematic diagram showing a ring oscillator the dynamic RAM.
Figure 13A:
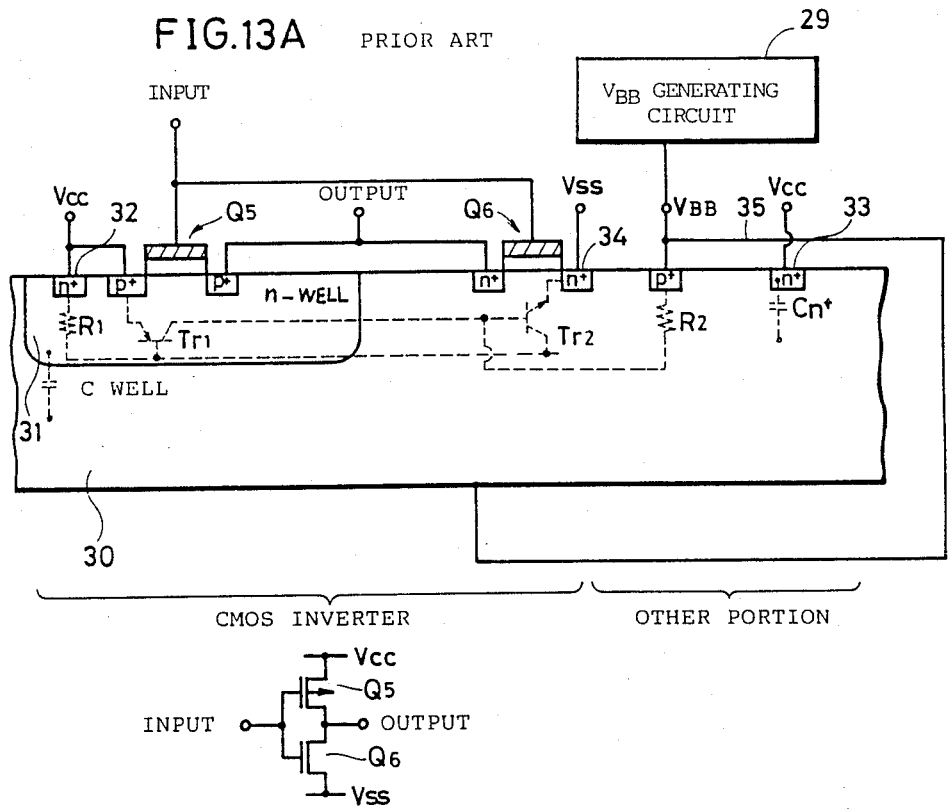
FIG. 13A is a cross sectional view showing a structure of a conventional CMOS inverter on a substrate.
Figure 13B:
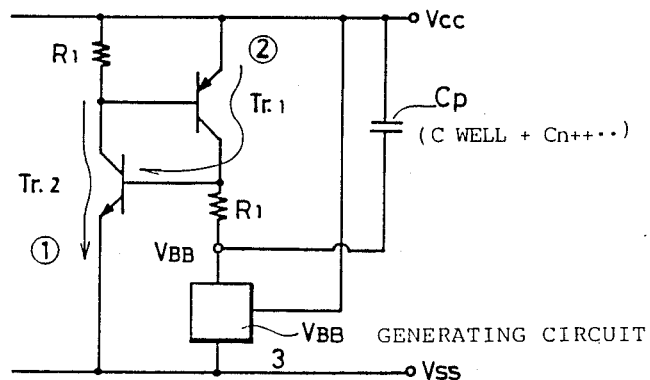
FIG. 13B an equivalent circuit diagram of a circuit constituted by parasitic transistors and parasitic capacitors formed on the substrate shown in FIG. 13A.
Figure 10:
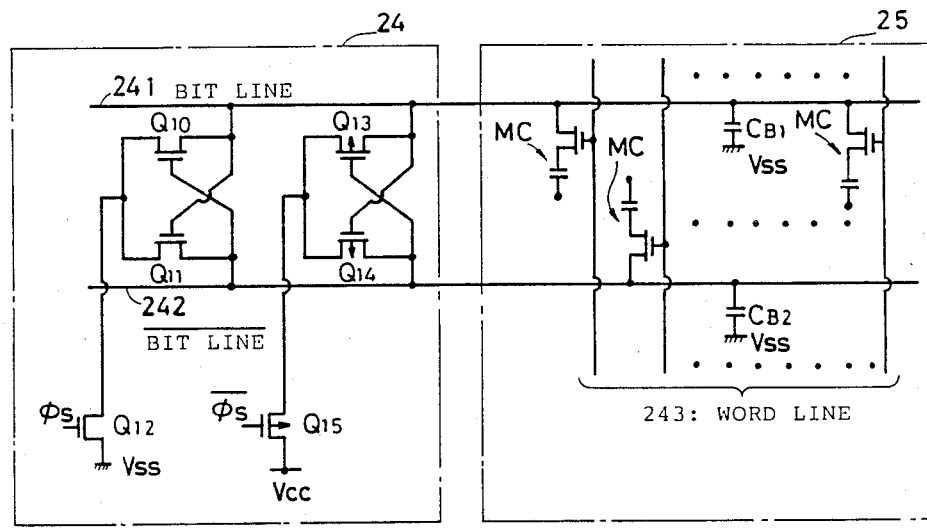
FIG. 10 schematic diagram showing portions of the sense amplifier and the memory array.
Figure 11:
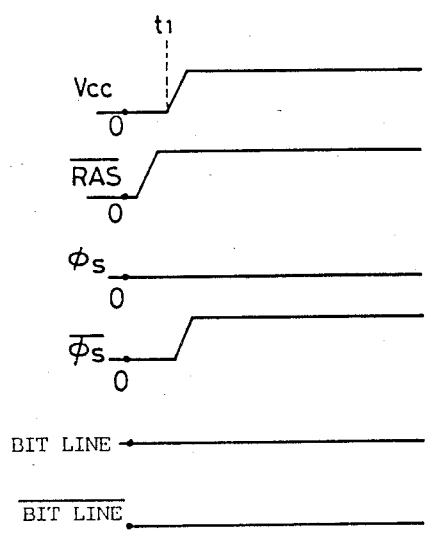
FIGS. 11 and 12 are timing charts for illustrating operations of the sense amplifier and the memory array shown in FIG. 10.
Figure 12:
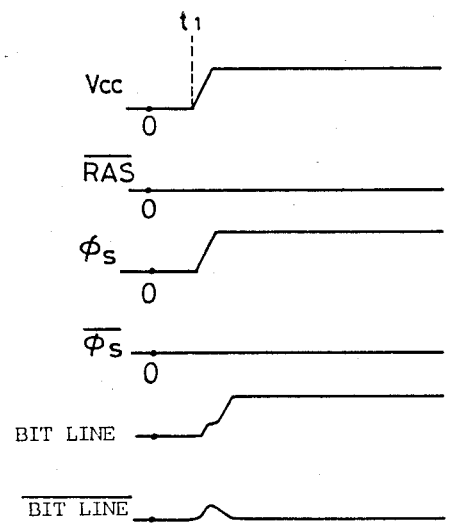

Meanwhile, the timing chart of FIG. 18 shows a case in which the power supply voltage $V_{CC}$ is applied to the dynamic RAM at the time $t_1$ with no high level $\overline{RAS}$ signal applied thereto. The $V_{BB}$ detecting circuit 50 outputs a high level signal $S_c$ at the time $t_4$. Since the AND gate 5d has received a high level signal from the inverter 5a, it outputs a low level signal in response to the signal $S_c$. Therefore, the node $N_c$ is brought to a low level at the time $t_5$, so that the dynamic RAM is brought to an active state. On this occasion, a current $I_{cc}$ whose peak value $I_a$ and $I_b$ is considerably smaller than the current value $I_3$ shown in FIG. 6 is flown in from the power supply $V_{CC}$, and is reduced to a value $I_4$ which is considerably smaller than $I_a$ and $I_b$ to be maintained there. The value $I_4$ is a current value required for the operation in the active state.

As described above, the dynamic RAM shown in FIG. 15 is brought to the standby state immediately after the power supply $V_{CC}$ is turned on irrespective of the level of the $\overline{RAS}$ signal. Consequently, the flow of the excessive current $I_3$ such as shown in FIG. 6 can be prevented.

In addition, since the switching signal $S_c$ is generated in response to the establishment of the substrate bias voltage ($V_{BB}$), the $\overline{RAS}$ signal applied to the terminal 4 is applied to the internal circuit 11 after the voltage $V_{BB}$ is applied to the substrate. Therefore, the latch-up phenomenon otherwise caused by the peak current $I_a$ and $I_b$ can be prevented.

Figure 19:
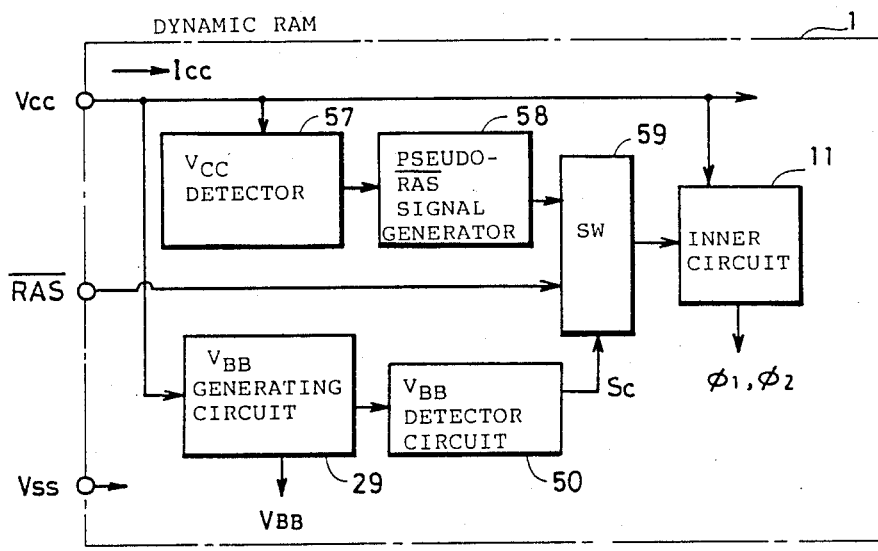
FIG. 19 is a circuit block diagram showing more functionally the circuit shown in FIG. 15.

FIG. 19 is a circuit block diagram more functionally showing the circuit shown in FIG. 15. As described above, the NAND gate 5d shown in FIG. 15 comprises a circuit having three functions shown in FIG. 19. Namely, the NAND gate 5d comprises a detector 57 detecting the application of the power supply $V_{CC}$, a generator 58 responsive to the detecting of the application of the power supply $V_{CC}$ for generating a high level pseudo $\overline{RAS}$ signal, and a switching circuit 59 responsive to the switching signal $S_c$ from the $V_{BB}$ detecting circuit 50 for selectively applying either the pseudo $\overline{RAS}$ signal or the externally applied RAS signal to an inner circuit 11.

Figure 20:
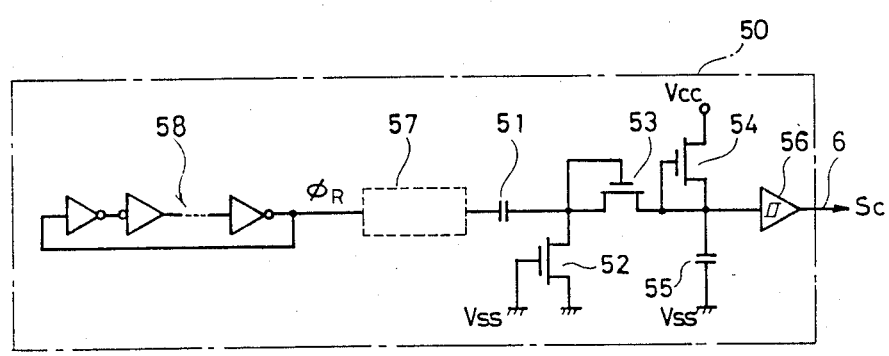
FIG. 20 is a circuit diagram showing another preferred example of the $V_{BB}$ detecting circuit shown in FIG. 15.

FIG. 20 is a schematic diagram showing another preferred example of the $V_{BB}$ detecting circuit 50. Referring to FIG. 20, compared with that shown in FIG. 16, the $V_{BB}$ detecting circuit 50 further comprises a ring oscillator 58 for generating pulse signals $\phi_R$ with the same frequency as the ring oscillator 291 in the $V_{BB}$ generating circuit 29. Therefore, the establishment of the substrate bias voltage ($V_{BB}$) can be detected without counting the signal $\phi_R$ from the ring oscillator 291 in the $V_{BB}$ generating circuit 29. In addition, as shown by the dotted line, a frequency dividing circuit 57 is provided between the ring oscillator 58 and the capacitor 51, whereby the timing of the change of the switching signal $S_c$ from the low level to the high level can be easily changed. The frequency detecting circuit 57 can be also applied to the $V_{BB}$ detecting circuit 50 shown in FIG. 16.

Figure 21:
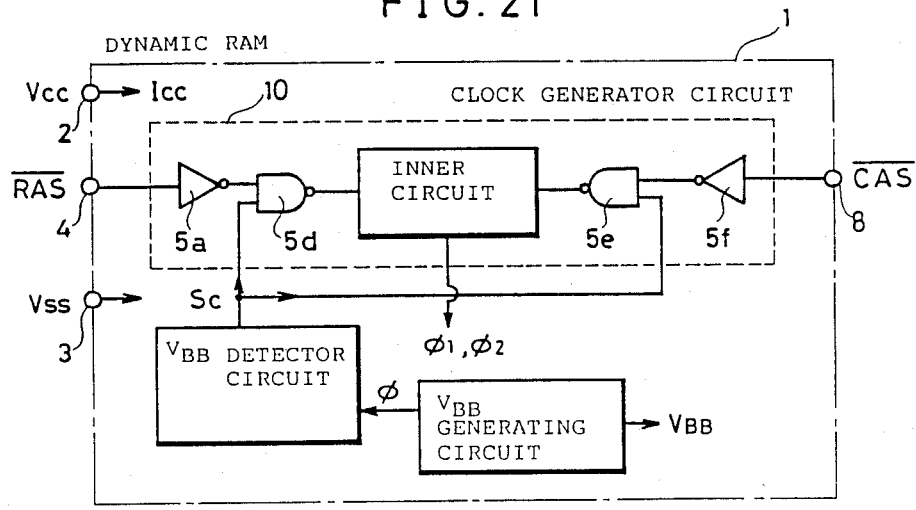
FIG. 21 is a block diagram showing an improved clock generator circuit and a circuit for controlling the same in a dynamic RAM in accordance with another embodiment of the present invention.

FIG. 21 is a block diagram showing an improved clock generator circuit and a circuit for controlling the same in a dynamic RAM in accordance with another embodiment of the present invention.

Referring to FIG. 21, compared with that shown in FIG. 15, the clock generator circuit 10 further comprises a NAND gate 5e and an inverter 5f. The inverter 5f is connected such that it recevies a $\overline{CAS}$ signal through a terminal 8. The NAND gate 5e pl is connected to receive the switching signal $S_C$. In operation, the flowing the flowing of the excessive current immediately after the power supply $V_{CC}$ is turned on can be prevented in the circuit controlled by the $\overline{CAS}$ signal as well as in the circuit controlled by the RAS signal described in the foregoing.

Although the embodiment of the present invention employing the clock generator circuit of a dynamic RAM as one example was described in the foregoing, the present invention is applicable to a static RAM and the same effect can be brought about. In the case in which the present invention is applied to the static RAM, a $\overline{CAS}$ (Chip Select) terminal is employed instead of the $\overline{RAS}$ terminal 4.

As described above, in the dynamic RAM of the present invention, the NAND gate 5d applies a high level signal to the inner circuit 11 when the power is applied, so that dynamic RAM is brought to the standby state. Consequently, the following of the excessive current immediately after the turning on of the power can be prevented. In addition, after the $V_{BB}$ is established, the dynamic RAM operates in response to the $\overline{RAS}$ signal. In other words, the dynamic RAM is not controlled by the $\overline{RAS}$ signal until $V_{BB}$ is established. Therefore, the latch-up phenomenon otherwise caused by the flowing current or $V_{BB}$ not rising immediately after the power is turned on can be prevented. Therefore, a semiconductor memory device with improved reliability can be provided in which there will be no excessive current after the power is turned on.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device (1) formed on a semiconductor substrate operative in a first operating state and a second operating state, wherein said memory device (1) consumes more current in said first operating state than in said second operating state, said semiconductor device (1) comprising:

at least one memory cell for storing data;

control means (11) responsive to an external control signal for controlling said memory device (1) to operate selectively in said first and second operating states;

power detector means (57) for detecting an application of power to said memory device;

pseudo state signal generating means (58) responsive to said power detector means (57) for generating a pseudo state signal defining said second operating state of said memory device (1);

substrate bias voltage generating means (29) receiving a power for generating a bias voltage to be applied to said substrate;

wherein said memory device (1) operates normally when a voltage of a prescribed level is applied to said substrate from said substrate bias voltage generating means (29), voltage establishment detector means (50, 58) detecting that the voltage generated by said substrate bias voltage generating means (29) is established in said prescribed level; and switching means (59) responsive to said voltage establishment detector means (50, 58) for selectively applying either an externally applied control signal or a signal from said pseudo state signal generating means (58) to said control means (11), wherein said control means (11) controls said memory device (1) to operate in said second operating state in response to said applied pseudo state signal.

2. A dynamic random access memory device (1) formed on a semiconductor substrate operative in a first operating state and a second operating state, wherein said memory device (1) consumes small current in said first operating state than in said second operating state, said dynamic random access memory device (1) comprising:

at least one memory cell for storing data;

control means (11) responsive to an external control signal for controlling said memory device (1) to operate selectively in said first and second operating states;

power detector means (57) for detecting an application of power to said memory device (1);

pseudo state signal generating means (58) responsive to said power detector means (57) for generating a pseudo state signal defining said second operating state of said memory device (1);

substrate bias voltage generating means (29) receiving a power for generating a bias voltage to be applied to said substrate;

wherein said memory device (1) operates normally when a voltage of a prescribed level is applied to said substrate from said substrate bias voltage generating means (29), voltage establishment detector means (50, 58) detecting that the voltage generated by said substrate bias voltage generating means (29) is established in said prescribe level; and switching means (59) responsive to said voltage establishment detector means (50, 58) for selectively applying either an externally applied control signal or a signal from said pseudo state signal generating means (58) to said control means (11), wherein said control means (11) controls said memory device (1) to operate in said second operating state in response to said applied pseudo state signal.

3. A dynamic random access memory device (1) according to claim 2, wherein said first operating state comprises an active operating state, and said second operating state comprises a standby operating state.

4. A dynamic random access memory device (1) according to claim 3, wherein said memory device (1) has a tendency to be said active operating state when power is applied for a first time.

5. A random access memory device (1) according to claim 2, wherein said substrate bias voltage generating means comprises:

first oscillating means (291) generating a pulse voltage signal upon application of power; and charge pump means (292) generating said bias voltage by charging the voltage signal generated by said first oscillating means.

6. A random access memory device (1) according to claim 5, wherein said voltage establishment detector means (50) comprises first counter means connected to said first oscillating means (291) for counting pulse voltage signals generated by said first oscillating means (291), said first counter means detecting the establishment of said substrate bias voltage by counting a prescribed number of said pulse voltage signals.

7. A random access memory device (1) according to claim 2, wherein said voltage establishment detector means (50) comprises:

second oscillating means (58) generating pulse voltage signals upon receipt of power; and second counter means connected to said second oscillating means (58) for counting pulse voltage signals generated by said second oscillating means (58), said second counter means detecting establishment of said substrate bias voltage by counting a prescribed number of said pulse voltage signals.

8. A random access memory device (1) according to to claim 7, wherein said voltage establishment detector means further comprises frequency dividing means (57) provided between said second oscillating means (58) and said second counter means for dividing pulse voltage signals generated by said second oscillating means (58) to apply the divided signals to said second counter means.

9. A dynamic random access memory device (1) according to claim 1, wherein said control address signal comprises at least one of a row address strobe signal and a column address strobe signal.

10. A method for operating a semiconductor memory device (1) formed on a semiconductor substrate and operative in a first operating state and a second operating state, wherein said memory device (1) consumes more current in said first operating state than in said second operating state, said device (1) comprising:

at lease one memory cell for storing data;

control means (11) responsive to an external control signal for controlling said memory device (1) to operate selectively in said first and second operating states; and substraste bias voltage generating means (29) receiving power for generating bias voltage to be applied to said substrate; wherein said memory device (1) operates normally when a voltage of a prescribed level is applied from said substrate bias voltage generating means (29) to said substrate:

said method comprising the steps of:

detecting an application of power to said memory device(1);

generating responsive to an application of power a pseudo state signal defining said second operating state of said memory device (1);

detecting that the voltage generated by said substrate bias voltage generating means is established in said prescribed level;

selectively applying responsive to said voltage establishment detector means (50, 58) either an external control signal or said pseudo state signal to said control means (11); and controlling said control means (11) to operate said memory device (1) in said second operating state in response to said applied pseudo state signal.

11. A method for operating a dynamic random access memory device (1) formed on a semiconductor substrate and operative in a first operating state and a second operating state, wherein said memory device (1) consumes more current in said first operating state than in said second operating state, said device (1) comprising:

at lease one memory cell for storing data;

control means (11) responsive to an eternal control signal for controlling said memory device (1) to operate selectively in said first and second operating states; and substrate bias voltage generating means (29) receiving power for generating bias voltage to be applied to said substrate; wherein said memory device (1) operates normally when a voltage of a prescribed level is applied from said substrate bias voltage generating means (29) to said substrate:

said method comprising the steps of:

detecting an application of power to said memory device (1);

generating responsive to an application of power pseudo state signal defining said second operating state of said memory device (1);

detecting that the voltage generated by said substrate bias voltage generating means is established in said prescribed level;

selectively applying responsive to said voltage establishment detector means (50, 58) either an external control signal or said pseudo state signal to said control means (11); and controlling said control means (11) to operate said memory device (1) in said second operating state in response to said applied pseudo state signal.

* * * * *